United States Patent [19]

Sugai et al.

[11] Patent Number: 4,640,723
[45] Date of Patent: Feb. 3, 1987

[54] LEAD FRAME AND METHOD FOR MANUFACTURING THE SAME

[75] Inventors: Shinzo Sugai, Chigasaki; Shigemi Yamane; Takashi Kuze, both of Yokohama, all of Japan

[73] Assignee: Tokyo Shibaura Denki Kabushiki Kaisha, Kawasaki, Japan

[21] Appl. No.: 563,445

[22] Filed: Dec. 20, 1983

[30] Foreign Application Priority Data

Dec. 23, 1982 [JP] Japan ................. 57-230402

[51] Int. Cl.$^4$ ............................................. C22D 1/08
[52] U.S. Cl. .................................. 148/411; 148/412; 148/413; 148/414
[58] Field of Search ................ 428/596; 148/411, 412, 148/413, 414; 420/492, 495

[56] References Cited

U.S. PATENT DOCUMENTS

| | | | |
|---|---|---|---|
| 3,392,016 | 7/1968 | Opie et al. | 75/153 |
| 4,047,980 | 9/1977 | Watson et al. | 148/411 |
| 4,049,426 | 9/1977 | Watson et al. | 148/411 |
| 4,067,750 | 1/1978 | Mravic et al. | 148/411 |
| 4,224,066 | 9/1980 | Watson et al. | 420/495 |
| 4,318,740 | 3/1982 | Koyama | 428/672 |
| 4,451,430 | 5/1984 | Matidori et al. | 420/492 |
| 4,482,611 | 11/1984 | Teshima et al. | 428/647 |

FOREIGN PATENT DOCUMENTS

| | | | |
|---|---|---|---|
| 730642 | 3/1966 | Canada | 420/492 |
| 23362 | 2/1981 | European Pat. Off. | 420/492 |
| 114338 | 8/1984 | European Pat. Off. | 420/492 |
| 2243731 | 3/1974 | Fed. Rep. of Germany | 420/492 |
| 2151844 | 4/1973 | France . | |
| 2198491 | 3/1974 | France . | |
| 155355 | 9/1982 | Japan | 420/492 |
| 512142 | 10/1938 | United Kingdom . | |
| 921795 | 1/1962 | United Kingdom . | |
| 1525355 | 9/1978 | United Kingdom . | |

OTHER PUBLICATIONS

"A New Copper Alloy with High Strength and Conductivity", Taubenblat et al., Metals Engineering Quarterly/Nov. 1972, pp. 41-44.
"Effect of Zirconium on the Tensile Strength, Hardness, and Structure of a Copper-1.2% Chromium Alloy," Pekalska, 1977, Chem. Abstracts 87:121487u.
"Precipitation Type Copper Alloys for Vacuum Apparatus", Sekiba et al., Aug. 1978, Chem. Abstracts 90:42836r.
"Copper Alloy Lead Wire", Tejima et al., Dec. 1977, Chem. Abstracts 88:157142n.
"Conductive Wire for Semiconductor Device", Jpn Kokai 80 78,412, Jun. 1980, Chem. Abstracts 93:229675s.
"Electrically Conductive Copper Alloy", Matidori et al., Feb. 1981, Chem. Abstracts 94:144022.

*Primary Examiner*—Melvyn J. Andrews
*Assistant Examiner*—John J. Zimmerman
*Attorney, Agent, or Firm*—Cushman, Darby & Cushman

[57] ABSTRACT

A lead frame consists of a copper alloy containing 0.1 to 1% by weight of chromium and 0.001 to 0.5% by weight of zirconium and having a precipitate with a grain size of 0.5 to 50 μm distributed therein at a rate of 1,000 to 10,000 grains/mm$^2$. The lead frame is manufactured by casting a copper alloy containing 0.1 to 1% by weight of chromium and 0.001 to 0.5% by weight of zirconium by continuous casting, and performing rolling, a solution treatment, a cold working, and an age-hardening. The lead frame has an excellent bonding performance with an Au wire, hardness and bending strength, and is inexpensive.

3 Claims, 3 Drawing Figures

F I G. 1
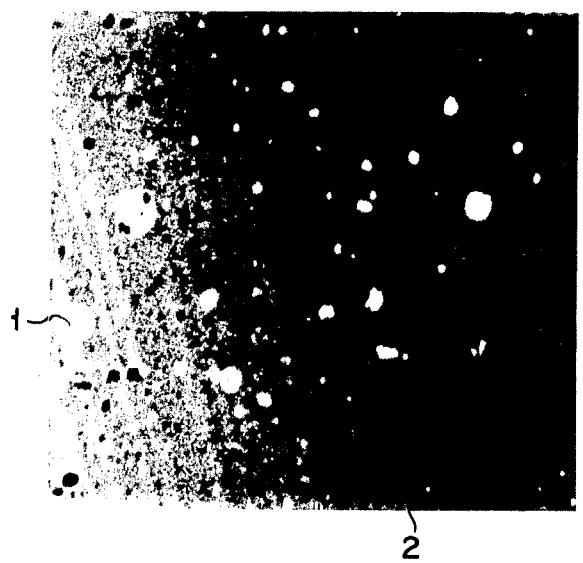

LEAD FRAME AND METHOD FOR MANUFACTURING THE SAME

BACKGROUND OF THE INVENTION

The present invention relates to a lead frame of a Cu alloy and a method for manufacturing the same.

A lead frame of an Fe-Ni alloy for a semiconductor IC is conventionally known. Such a lead frame made of an Fe-Ni alloy has a high hardness and an excellent bending strength, but is expensive.

An inexpensive Cu alloy is being considered to take the place of such an Fe-Ni alloy. However, a Cu alloy which simultaneously satisfies all the requirements of a lead frame such as bonding performance with an Au wire, a hardness, a bending strength and the like has not yet been proposed.

When Sn or Ni is added to Cu in order to obtain a Cu alloy of higher hardness, bonding performance with an Au wire and soldering performance of the resultant alloy are impaired. When Zr or Cr is added in order to improve bonding performance with an Au wire, bending strength is impaired.

SUMMARY OF THE INVENTION

In view of this problem, the present inventors have made extensive studies. As a result of such studies, it was found that a degradation in bending strength of a Cu alloy containing Zr and Cr is attributable to the manufacturing method thereof, and that a lead frame which satisfies all the requirements regarding bonding performance with an Au wire, hardness, bending strength and the like can be obtained if the manufacturing method is improved.

The present invention has been made based on this finding and has for its object to provide a lead frame which has an improved bonding performance with an Au wire, hardness and bending strength, and a method for manufacturing the same.

A lead frame of the present invention comprises a Cu alloy which contains 0.1% to 1% by weight of Cr and 0.001 to 0.5% by weight of Zr, and in which a precipitate having a grain size of 0.5 to 50 μm is distributed at a rate of 1,000 to 10,000 grains/mm². A method for manufacturing a lead frame according to the present invention comprises the steps of casting a Cu alloy containing 0.1 to 1% by weight of Cr and 0.001 to 0.5% by weight of Zr by continuous casting, performing rolling, performing a solution treatment, performing cold working and performing an age-hardening.

BRIEF DESCRIPTION OF THE DRAWINGS

FIG. 1 is a microphotograph taken by an electron microscope of a metal body of a Cu alloy of a lead frame of the present invention;

DETAILED DESCRIPTION OF THE PREFERRED EMBODIMENTS

The Cr content and Zr content of the alloy are very important in the present invention. If the Cr content is 0.1% by weight or more, the mechanical strength and heat resistance of the alloy are increased. The effect mentioned is maintained without impairing the bending strength and electrical conductivity of the alloy until the Cr content reaches 1% by weight. On the other hand, the mechanical strength and heat resistance of the alloy are improved if the Zr content is 0.001% by weight or more. The effect mentioned is maintained without impairing the bending strength and electrical conductivity of the alloy until the Zr content reaches 0.5% by weight.

According to the present invention, from the viewpoint of a further improved mechanical strength, the alloy preferably contains, in addition to Cr and Zr, a total amount of 1% by weight or less of one or more members selected from Mg, Si, Sn, Ni, Fe, Zn, Mn, P, B, Ag, Be, Co, Ti and Y.

In the age-hardening step, the Cr and Zr added to the Cu precipitate in the forms of various compounds with Cu, and gradually grow in the Cu alloy matrix, thereby hardening the alloy.

FIG. 1 is a microphotograph (×500) showing the state of the precipitate in the Cu alloy which has been subjected to age-hardening.

Referring to FIG. 1, refernce numeral 1 denotes a precipitate and 2 denotes a Cu base.

According to the present invention, when a precipitate having a grain size of 0.5 to 50 μm is distributed at a rate of 1,000 to 10,000 grains/mm², a Cu alloy exhibits the required characteristics.

When the distribution of precipitate is less than 1,000 grains/mm², the effect of the present invention is not obtained. If, on the other hand, the distribution of precipitate exceeds 10,000 grains/mm², the bending strength of the resultant alloy is degraded.

In order to prepare a Cu alloy containing a precipitate having the size and distribution as defined above, the following procedures are taken.

First, a Cu alloy containing, Cr, Zr and the like is prepared by continuous casting. Smelting casting is started from a smelting temperature of 1,100° to 1,300° C. and is solidified at a cooling rate of about 10° C./sec or higher. Enlargement of the precipitate size can be suppressed by increasing the cooling rate to about 10° C./sec or more.

After performing hot or cold rolling, a solution treatment is performed. Cold working such as cold rolling is then performed in order to form the alloy to a predetermined size. Age-hardening is performed by heating at 400° to 600° C. for 0.5 to 10 hours and preferably for 1 to 5 hours.

A resultant lead frame consists of a Cu alloy wherein a precipitate is finely and uniformly distributed, and has an excellent bending strength, hardness and so on.

EXAMPLES

The present invention will now be described by way of its examples.

Figure 2:
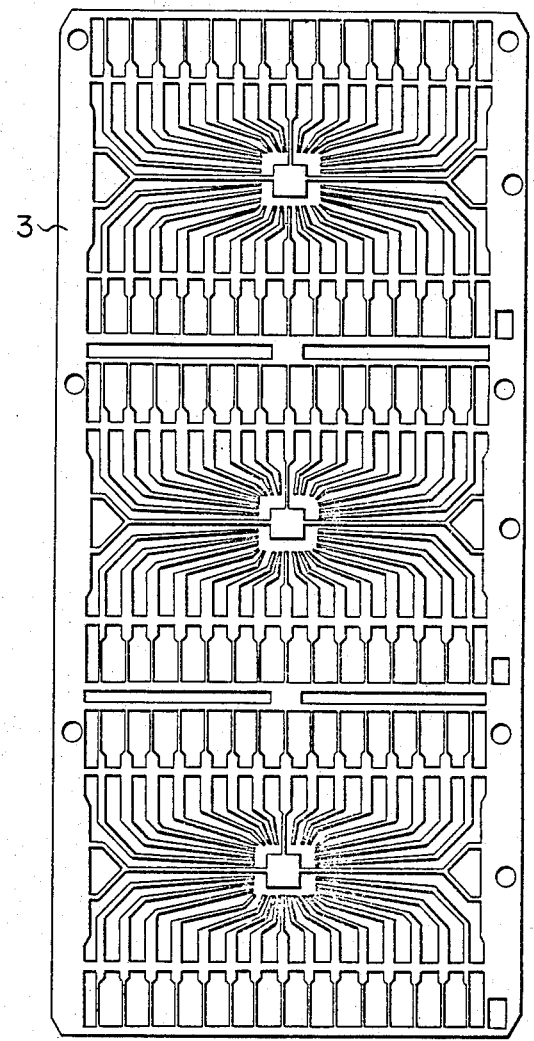
FIG. 2 is a plan view of a lead frame according to an embodiment of the present invention.

Cu alloys having the compositions as shown in the Table below were prepared by continuous casting, were hot rolled, and were subjected to a solution treatment. In the continuous casting step, the molten alloy was kept at a temperature of 1280° C. and the cooling rate was about 80° C./sec. Cold rolling was then performed to roll each alloy to a plate having a thickness of 0.25 mm. After performing age-hardening at 450° C. for 1 hour, the plate was punched to prepare a lead frame 3 of a shape as shown in FIG. 2.

Figure 3:
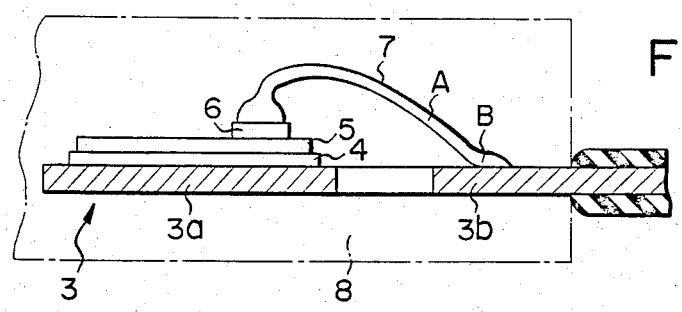
FIG. 3 is a sectional view showing the connected state between a lead frame and an Au wire.

In the lead frames having the compositions of sample Nos. 1 to 4 obtained in this manner, a precipitate having a grain size of 0.5 to 50 μm was distributed uniformly at a rate of 1,000 to 10,000 grains/mm². The obtained samples were tested for their bending strength, hardness and bonding peformance with an Au wire. They all exhibited good results as shown in the Table below. In the Table below, the bonding performance was tested by the method to be described below. As shown in FIG. 3, a silicon wafer 5 was adhered to a chip mount portion 3a of a lead frame 3 of the present invention through an adhesive 4. After forming an Au deposition film 6 thereover, the deposition film 6 and a corresponding connecting portion 3b were directly connected through an Au wire 7 without Ag plating. In the Table, a sample which broke down at portion A of the Au wire 7 is indicated by symbol o, and a sample which broke down at portion B is indicated by symbol Δ. Reference numeral 8 in FIG. 3 denotes a resin molded portion.

COMPARATIVE EXAMPLE

A sample Cu alloy designated No. 5 in the Table below was prepared. The Cu alloy was placed in a general casting mold and was cooled, rolled, and subjected to a solution treatment. In this case, the interior of the mold is slowly cooled; the cooling rate is thought to be about 5° C./sec or less. The alloy was then cold rolled to a plate of the same size as that in the Examples, and the plate was subjected to age-hardening.

A lead frame obtained in this manner had a big precipitate (grain size 50 to 100 μm) distributed therein at a rate of not more than about 1,000 grains/mm². Therefore, the alloy had an unsatisfactory bonding performance with an Au wire, and a bending strength and a hardness of the alloy were insufficient.

TABLE

|  |  | Alloy component (wt %); balance: Cu | | | | | | Bending strength* | Hardness [Hv] | Bonding performance |
| --- | --- | --- | --- | --- | --- | --- | --- | --- | --- | --- |
|  |  | Cr | Zr | Mg | Sn | Ni | P |  |  |  |
| Example | 1 | 0.65 | 0.40 | 0.02 | — | — | 0.01 | 4.8 | 151 | o |
|  | 2 | 0.55 | 0.31 | — | 0.25 | — | 0.01 | 4.5 | 155 | o |
|  | 3 | 0.57 | 0.35 | — | — | 0.31 | 0.01 | 4.3 | 158 | o |
|  | 4 | 0.61 | 0.36 | — | — | — | — | 5.1 | 151 | o |
| Comparative Example | 5 | 0.62 | 0.33 | 0.02 | — | — | 0.01 | 3.6 | 135 | Δ** |

*Repeated bend test at 90° C.
**Some suffered defective bonding

In summary, a lead frame according to the present invention has an excellent bonding performance with an Au wire, hardness and bending strength, and is inexpensive.

What is claimed is:

1. A lead frame comprising a copper alloy containing 0.1 to 1% by weight of chromium and 0.001 to 0.5% by weight of zirconium and having a precipitate with a grain size from 0.5 to 50 μm distributed therein at a rate of 1,000 to 10,000 grains/mm².

2. A lead frame according to claim 1, wherein the copper alloy further contains not more than 1% by weight of at least one member selected from the group consisting of magnesium, silicon, tin, nickel, iron, zinc, manganese, phosphorus, boron, silver, beryllium, cobalt, titanium and yttrium.

3. A lead frame comprising a copper alloy containing 0.1 to 1% by weight of chromium and 0.001 to 0.5% by weight of zirconium and having a precipitate with a grain size from 0.5 to 50 μm distributed therein at a rate of 1,000 to 10,000 grains/mm², wherein the copper alloy further contains not more than 1% by weight of at least one member selected from the group consisting of magnesium, silicon, tin, nickel, iron, zinc, manganese, phosphorus, boron, silver, beryllium, cobalt, titanium and yttrium, said copper alloy being formed by the sequential steps of continuously casting the alloy, rolling the cast alloy, solution treating the alloy, cold working the alloy, and age-hardening the alloy.

* * * * *